United States Patent [19]
Norris

[11] 3,983,267
[45] Sept. 28, 1976

[54] TREATMENT OF THE SURFACES OF POLYPHENYLENE OXIDE MATERIALS

[75] Inventor: Philip John Norris, Burton-on-Trent, England

[73] Assignee: W. Canning & Company Limited, Birmingham, England

[22] Filed: Sept. 23, 1974

[21] Appl. No.: 508,356

[30] Foreign Application Priority Data
Sept. 25, 1973 United Kingdom............... 44863/73

[52] U.S. Cl.................................. 427/307; 204/20; 204/30; 204/38 B; 427/304
[51] Int. Cl.².................... B05D 3/10; C25D 5/56
[58] Field of Search ............ 204/20, 30, 38 E, 38 B; 117/47 A; 427/307

[56] References Cited
UNITED STATES PATENTS

| | | | |
|---|---|---|---|
| 3,592,680 | 7/1971 | Bayer............................... | 427/307 X |
| 3,620,804 | 11/1971 | Bauer et al. ....................... | 117/47. A |
| 3,686,017 | 8/1972 | Menikheim et al............... | 117/47 A |
| 3,702,285 | 11/1972 | Knorre et al........................... | 204/30 |
| 3,704,156 | 11/1972 | Foley, Jr. et al.................. | 117/47 A |
| 3,758,332 | 9/1973 | Dinella et al .................... | 427/307 X |
| 3,790,400 | 2/1974 | Kuzmik........................... | 427/307 X |

OTHER PUBLICATIONS

W. Latimer, "Oxidation Potentials," Prentice–Hall, N.Y. (1952), p. 109.

*Primary Examiner*—John H. Mack
*Assistant Examiner*—Aaron Weisstuch
*Attorney, Agent, or Firm*—Marn & Jangarathis

[57] ABSTRACT

The conventional electroless plating process for polymers involving (1) acid etching (2) activation by a mixture of tin salts and precious metal salts applied jointly or consecutively and (3) electroless deposition on to the activated surface, is improved by an intermediate treatment with a reducing acid solution between stages (1) and (2). Phosphorous, hypophosphorous, ortho-, hypo- and pyrophosphoric acids, preferably in amounts from 25–500 g./l. and optionally with their alkali metal and/or ammonium salts in amounts up to 500 g./l. as buffers can be used for immersions of up to 20 minutes at temperatures up to 70°C. Poly phenylene oxides, ABS polymers, and polyolefins can be treated.

6 Claims, No Drawings

TREATMENT OF THE SURFACES OF POLYPHENYLENE OXIDE MATERIALS

This invention concerns an improvement in the treatment of the surfaces of synthetic polymeric materials so as to prepared them to receive an adherent coating of electrodeposited metal.

Processes for electroplating on to polymers such as acrylonitrile-butadiene-styrene polymers, polypropylenes, polysulphones, or poly aryl ethers are already known, but are not generally suitable for plating on to poly phenylene oxide since the electrodeposited metal has poor adherence and the product is not commercially acceptable.

The present process, however, enables plating of poly phenylene oxide to be carried out successfully and can also be advantageously utilised with other polymers as listed above.

Generally, conventional processes for preparing polymers to be electroplated comprise several stages consisting of successive immersions in liquids.

The first stage is immersion in an acid solution containing chromic and sulphuric acids and sometimes phosphoric acid, which immersion etches the polymer surface to render it hydrophilic and also provides a keying effect to promote adhesion between the polymer surface and subsequent coatings. Following this first stage ("acid etching") the component is thoroughly rinsed to remove all traces of chromic acid in the covering of etching solution retained by the components and by the racks on which they are mounted. This rinsing stage is very important as the presence of hexavalent chromium ions in subsequent solutions acts as a poison in them. If such ions are retained by adsorption on the polymer surface they prevent it receiving a uniform deposition of subsequent coatings. Hence, multiple rinse-tanks and spray rinses are usually employed, often with an intermediate immersion in an alkaline or acid solution.

The second stage, is called herein "activation". Its purpose is to provide active nuclei of the catalyst metal adsorbed onto the surface of the polymer. It involves either (a) immersion first in stannous chloride solution and then, after rinsing, in an activating bath containing in solution a catalytic precious metal (usually palladium but some times gold or silver) or (b) immersion in a solution containing both the tin salts and the precious metal. (This solution is often termed an "activator") and thereafter rinsing and immersing the surface in a so-called "accelerator", (usually a dilute acid solution) to modify the chemical nature of the tin component of the adsorbed activator.

After water rinsing of the polymer surface the third stage is carried out. This involves immersion in an electroless plating bath, usually containing copper or nickel values, and is catalysed by the active precious metal nuclei to produce a thin but dense conductive coating.

The polymer may then be electroplated by means of using this thin but adherent coating of metal as the initial conductor to carry the necessary current until the thickness of the superimposed electrodeposited layer becomes significant.

When polyphenylene oxide is processed through these conventional solutions, its surface is rendered hydrophilic by etching (the first stage) but it still will not readily accept the precious metal activation i.e. the second stage. Examination of the topography of the etched structure, for example by the scanning electron microscope, reveals no obvious reason why this should be so. The probable reason is that there is no ionic charge on the surface of the etched polymer (or perhaps there may be an ionic charge of the wrong sign) for while it is generally agreed that the etched structure forms the basis for the adhesion of the subsequently applied metal layer, the initial reason for small precious metal nuclei attaching themselves to the polymer must be ionic attraction and so the surface of the etched polymer must have suitable polar groups available. However, the scope of the present invention as defined below is not dependent in any way upon the above hypotheses.

One prior method suggested for treating such polymers as poly phenylene oxide that are difficult to plate is to use a suitable ionic or non-ionic surfactant in solution as a separate bath in the process sequence, e.g., immediately prior to the second stage or activation. This produces a bonded layer on the polymer and precious metal nuclei adhere to this rather than to the polymer itself. The disadvantages of this method are that the overall adhesion is generally poor and that the plated components need prolonged ageing or heat treatment prior to use. Also the plastics insulated coatings used on the jigs upon which moulded components are fixed for eventual plating tend also to become activated and so become coated with electroplate, a waste of metal at the expense of the components being plated.

Another prior method is to treat the polymer at the outset in an organic solvent so as to swell or gell its surface, and then to oxidise this surface during the subsequent acid etching process (stage 1) so as to produce a surface suitable for activation, i.e. the second stage. The disadvantages of this method are that the baths of solvent need careful control and can form fire or health hazards and also that the surface appearance of the polymer deteriorates during the treatment, which can result in poor visual appearance of the plated surface.

The present invention provides a process for the treatment of a surface of a synthetic polymeric material to give an electroless deposit of metal suitable for subsequent electroplating, the process being of the type involving the consecutive stages of: (1) etching of the surface with acid; (2) activation of the surface by a combination of precious metal catalyst and tin salts such as stannous chloride to provide active catalyst nuclei on the surface, and, when a combined catalyst/tin salt bath is used, contact with an aqueous accelerator solution to remove the tin component; and (3) electroless plating of an electrically conductive adherent metal coating; each of said consecutive stages (1) (2) and (3) being separated by suitable rinsing stages; wherein after the etching stage (1) but prior to the activation stage (2) the surface is treated with a strongly reducing aqueous solution of at least one acid.

The acid may be phosphorous, hypophosphorous, orthophosphoric, hypophosphoric, or pyrophosphoric acid, or a mixture of two or more thereof, and the solution may be buffered with a suitable salt or salts of the acid or acids listed.

The polymeric material is preferably a polyphenylene oxide polymer, but other polymers such as ABS (acrylonitrile-butadiene-styrene) polymers or polyolefins such as polypropylene can readily be treated by any of the acids.

It appears that these reducing acid solutions act as an efficient reducing agent for hexavalent chromium, thus minimising the disadvantage mentioned above, and they are therefore preferably applied after rinsing the surface generally free of the acid etch solution.

The preferred concentration of these acids varies between 25 g/l and 500 g/l. Lower concentrations can be used if the immersion times are prolonged or high solution temperatures are employed. Concentrations up to saturation are technically satisfactory, but commercially uneconomic. These solutions can also contain one or more alkali metal or ammonium salts of the above acids, e.g. phosphites, hypophosphites, phosphates or pyrophosphates, to act as buffers, with concentrations ranging from zero to 500 g/l. Such salts appear to improve the action of the acids when poly phenylene oxides are treated.

The time required for immersion depends on the concentration of the dissolved acids and salts in the aqueous solution and the solution temperature, and generally ranges up to 20 minutes, preferably from 1 to 10 minutes, at temperatures up to 70°C preferably 15°–65°C.

Improvements in adhesion and/or coverage of metal electrodeposits were found to be provided when the solution of the invention was used as an additional intermediate stage between etching and activating.

This solution can be provided in a concentrated, solid or liquid form, so as to be easily made into a working bath.

As indicated above, the other components to be used in the other stages are generally conventional. Thus, acid etching is carried out usually with chromic and sulphuric acids but sometimes with phosphoric acid as well; activation can be carried out with two consecutive baths or in a combined bath, while the electroless plating is usually of copper or nickel.

While the process as outlined above is a primary aspect of the invention, the overall process involving subsequent electroplating, and the products of each process are also features of the present invention.

The present invention will be further described with reference to the following Examples.

GENERAL PROCEDURE OF EXAMPLES

1. ETCHING was carried out (with one exception described below) on circular plaques of polymer with a conventional solution containing chromic and sulphuric acids in concentrations well-known to the man in the art for treatment of ABS polymers, and at a temperature of 65°C for 3 minutes. This was terminated by thorough rinsing in clean water.

1a. The ADDITIONAL STEP according to the invention was carried out by immersion for five minutes in a bath under the conditions shown in the following table, which itemises the polymer used, the composition of the immersion solution, temperature of immersion and results in terms of eventual time for effective electroless deposition. Again, thorough water rinsing was carried out.

2. ACTIVATION was carried out by a conventional two-step process, the first step being dipping in a conventional activator solution of palladium and tin salts at 30°C for 5 minutes and the second step (after rinsing in clean water) being dipped in a conventional 20% v/v solution of concentrated acid at room temperature for 2 minutes. This is again followed by thorough water rinsing.

3. ELECTROLESS PLATING was carried out using a conventional nickel electroless plating solution available under the trade mark NIPLAS at 30°C, the time to effective complete coverage being noted and recorded in the table.

4. ELECTROPLATING

The products after electroless plating were water-rinsed, dipped in dilute sulphuric acid, water-rinsed again and thickly electroplated with bright levelling copper electrodeposits from an acid copper sulphate bath.

Peel adhesion tests were carried out on these samples before heat treatment, and similar samples were thermally cycled according to B.S. 4601:1970 (Appendix F-Test D).

The following table shows the conditions used in the additional step of the invention.

TABLE

| EXAMPLE NO. | TYPE OF POLYMER | BATH COMPONENTS | | | | IMMERSION TEMP. °C. | COVERING TIME(SECS) |
| --- | --- | --- | --- | --- | --- | --- | --- |
| | | % w/v | ACID | % w/v | SALT | | |
| 1 | PPO | 10 | OPA | — | — | 60 | 90 |
| 2 | PPO | 10 | OPA | 10 | SHP | 40 | 60 |
| 3 | PPO | 10 | OPA | 10 | SHP | 60 | 20 |
| 4 | PPO | 10 | HPA | — | — | 60 | 35 |
| 5 | PPO | 30 | HPA | — | — | 60 | 20 |
| 6 | PPO | 20 | PA | — | — | 60 | 45 |
| 7 | PPO | 10 | PA | 10 | SHP | 60 | 20 |
| 8 | PPO | 30 | PA | — | — | 30 | 60 |
| 9 | PPO | 10 | PA | 10 | DHOP | 20 | 60 |
| 10 | ABS | 10 | PA | 10 | SHP | 60 | 10 |
| 11 | PP | 10 | HPA | — | — | 60 | 20 |

The abbreviations used in the above table are as follows:

PPO — a plating grade of poly phenylene oxide available under the Trade Mark "NORYL PN.235".

ABS — a plating grade acrylonitrile-butadiene-styrene polymer available under the Trade Mark "CYCOLAC EP. 3510"

PP — a plating grade polypropylene available under the designation "PXC 4717" (N.B. In this instance etching was carried out for 10 minutes at 80°C in a mixture of sulphuric, phosphoric and chromic acids at concentrations previously known to be suitable for polypropylene etching).

OPA — orthophosphoric acid.

SHP — sodium hypophosphite.

HPA — hypophosphorous acid

PA — phosphorous acid

DHOP — diammonium hydrogen orthophosphate.

RESULTS

The covering time is as shown in the table for each Example. On subsequent electroplating and peel testing, as described above it was observed that a processing temperature of 60°C gave adhesions of 3 to 5 pounds per inch but the lower processing temperatures of 40°C, 30°C or 20°C gave adhesions of 1 or 2 pounds per inch. Heat treatment significantly improved peel adhesion. All Examples passed the thermal cycling without failure.

I claim:

1. A process for preparing the surface of a polyphenylene oxide material for electroless deposit of metal prior to activation of the surface thereof, comprising:
etching the surface of the material with an etch containing chromic acid, and treating the etched surface with an aqueous solution containing at least one strongly reducing acid selected from the group consisting of phosphorous acid, hypophosphorous acid and hypophosphoric aicd.

2. A process as claimed in claim 1 wherein the acid concentration is from 25 to 500 g./l.

3. A process as claimed in claim 1 wherein the solution is buffered with at least one salt of at least one of the said acids.

4. A process as claimed in claim 3 wherein the solution is buffered with up to 500 g./l. of at least one member selected from the group consisting of the alkali metal and ammonium salts of at least one of the said acids.

5. A process as claimed in claim 1 wherein the surface is immersed for 1 to 10 minutes at 15° to 65°C.

6. The process of claim 1 wherein said strongly reducing acid is phosphorous acid, said phosphorous acid being buffered with sodium hypophosphite.

* * * * *